United States Patent [19]

Mizuno et al.

[11] Patent Number: 4,906,945
[45] Date of Patent: Mar. 6, 1990

[54] MILLIMETER-WAVE/SUBMILLIMETER-WAVE OSCILLATOR

[75] Inventors: Koji Mizuno, Sendai; Haruyoshi Endo, Zama; Mitsuo Makimoto, Yokohama, all of Japan

[73] Assignee: Matsushita Electric Industrial Co., Ltd., Osaka, Japan

[21] Appl. No.: 340,748

[22] Filed: Apr. 20, 1989

[30] Foreign Application Priority Data

Apr. 25, 1988 [JP] Japan .................................. 63-102124

[51] Int. Cl.$^4$ ............................................. H03B 1/00
[52] U.S. Cl. ........................................ 331/96; 331/25
[58] Field of Search ........... 331/25, 96, 107 R, 107 G; 315/39; 307/424–429

[56] References Cited

U.S. PATENT DOCUMENTS 4,286,230 8/1981 Morrison et al. ................. 331/96 X Primary Examiner—Eugene R. LaRoche
Assistant Examiner—Robert J. Pascal
Attorney, Agent, or Firm—Lowe, Price, LeBlanc, Becker & Shur

[57] ABSTRACT

There is disclosed herein a millimeter-wave/submillimeter-wave oscillator comprising a mirror and a diffraction grating so as to form a Fabry-Perot type resonator. The mirror, being a concave mirror or a plane mirror, and the diffraction grating are disposed in facing and spaced relation to each other. The diffraction grating has a plurality of channels extending in a direction normal to a surface of the mirror so that the oscillator has a comb-like configuration. A plurality of oscillation elements are mounted on portions within the channels of the diffraction grating.

12 Claims, 3 Drawing Sheets

MILLIMETER-WAVE/SUBMILLIMETER-WAVE OSCILLATOR

BACKGROUND OF THE INVENTION

The present invention relates generally to oscillators for, in response to an input signal, generating a periodically varying electrical output within a frequency range such as a millimeter wave and a submillimeter wave.

A Gunn diode oscillator having a waveguide construction is a known solid-state oscillator for generating an output existing within the millimeter or submillimeter band. However, such a diode oscillator requires a larged-sized resonator in comparison with wavelengths and is difficult to manufacture with the required accuracy. In order to avoid this problem a Fabry-Perot type resonator has been proposed whereby it is possible to realize a large-sized resonator in comparison with wavelengths. However, a solid-state oscillator with the Fabry-Perot type resonator has disadvantages in terms of mechanical strength and heat radiation and hence is not yet in practical use. Thus, a further improvement would be required from the veiwpoint of practical use.

SUMMARY OF THE INVENTION

It is therefore an object of the present invention to provide a high-performance oscillator for generating an oscillation output existing within the millimeter-wave or submillimeter-wave range, which oscillator is capable of increased output concurrently with cost reduction.

With this and other objects which will become apparent as the description proceeds, a millimeter-wave/submillimeter-wave oscillator according to the present invention comprises a mirror and a diffraction grating so as to form a Fabry-Perot type resonator. The mirror, being a concave mirror or a plane mirror, and the diffraction grating are disposed in facing and spaced relation to each other. The diffraction grating has a plurality of channels extending in a direction normal to a surface of the mirror so that the oscillator has a comb-like configuration and the channels act as waveguides. A plurality of oscillation elements are mounted on portions within the channels of the diffraction grating. Preferably, a control circuit applies a phase-locked control signal to one of the plurality of oscillation elements. The control circuit comprises a reference oscillator for generating a reference oscillation signal, a frequency multiplexer for multiplexing the reference oscillation signal, a mixer mixing the output of the frequency multiplexer and the RF (radio frequency) output from the millimeter-wave/submillimeter-wave oscillator, a frequency divider for dividing the output of the mixer, and a phase comparator for comparing the output of the frequency divider in phase with the output of a temperature-compensation crystal oscillator. The output of the phase comparator is supplied to a driver which in turn supplies a control signal corresponding to the phase difference therebetween to the one of the plurality of oscillation elements.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
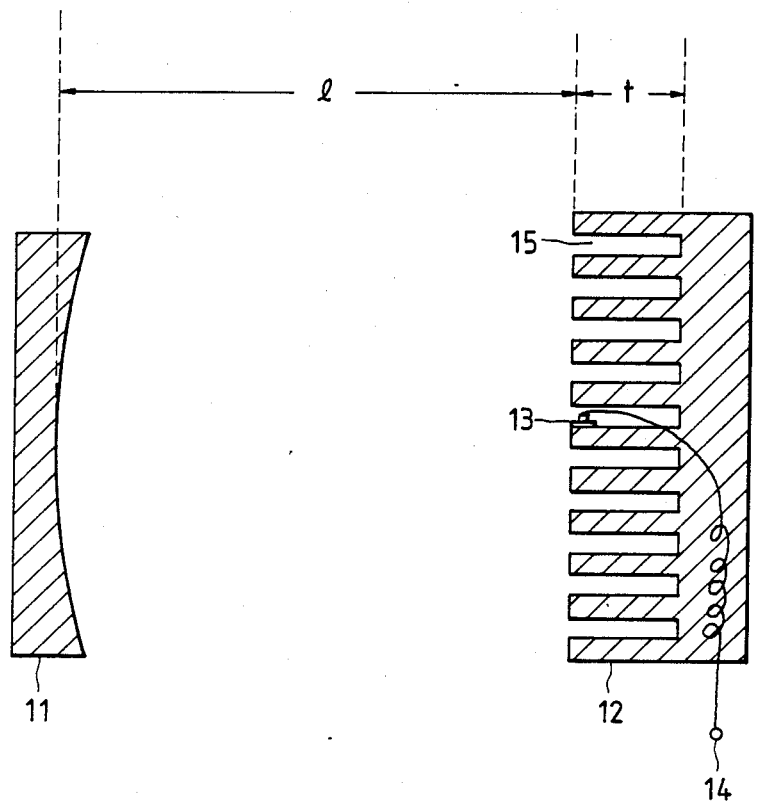
FIG. 1 is a side cross-sectional view showing a millimeter-wave and submillimeter-wave oscillator according to an embodiment of the present invention.

Referring now to FIG. 1, there is illustrated an oscillator according to an embodiment of the present invention. In FIG. 1, illustrated at numeral 12 is a diffraction grating which is made of a conductive material and which is placed in opposed and spaced relation to a concave mirror 11 made of a metal, the distance therebetween being set to be l. The diffraction grating 12 functions as a plane reflection mirror and has a plurality of channels 15, having a depth of t, so as to form a comb-like configuration. On the diffraction grating 12 is provided a solid-state oscillation element 13 such as a Gunn diode and an IMPATT diode (impact avalanche and transit time diode). The soild-state oscillation element 13 is directly mounted on an end portion of the diffraction grating 12 so as to be disposed in one channel 15 thereof. The direct mounting causes the diffraction grating 12 to act as a heat radiator for the solid-state oscillation element 13. The solid-state oscillation element 13 is responsive to a direct-current bias supplied through a terminal 14.

In the above-mentioned arrangement, the diffraction grating 12 is arranged such that the pitch of the channel 15 is smaller than ½ of the operation wavelength and the channel 15 is constructed so as to easily enable mounting the solid-state oscillation element 13 thereon. Furthermore, the channel 15 acts as a parallel flat-plate waveguide one end of which is shorted. The depth t of the channel 15 may be determined in accordance with the short-circuit condition. Here, the resonance mode of the resonator made between the concave mirror 11 and the diffraction grating 12 is TEMoo and the resonance frequency is determined on the basis of the distance l between the cancave mirror 11 and the diffraction grating 12. The distance l therebetween may be determined appropriately to be above several times of the oscillation frequency so as to allow sufficiently increasing the length of the resonator and make easy the adjustment of the frequency. Although in this embodiment the cancave mirror 11 is provided in facing relation to the diffraction grating 12, it is also appropriate to use a plane mirror instead of the concave mirror 11.

Figure 2:
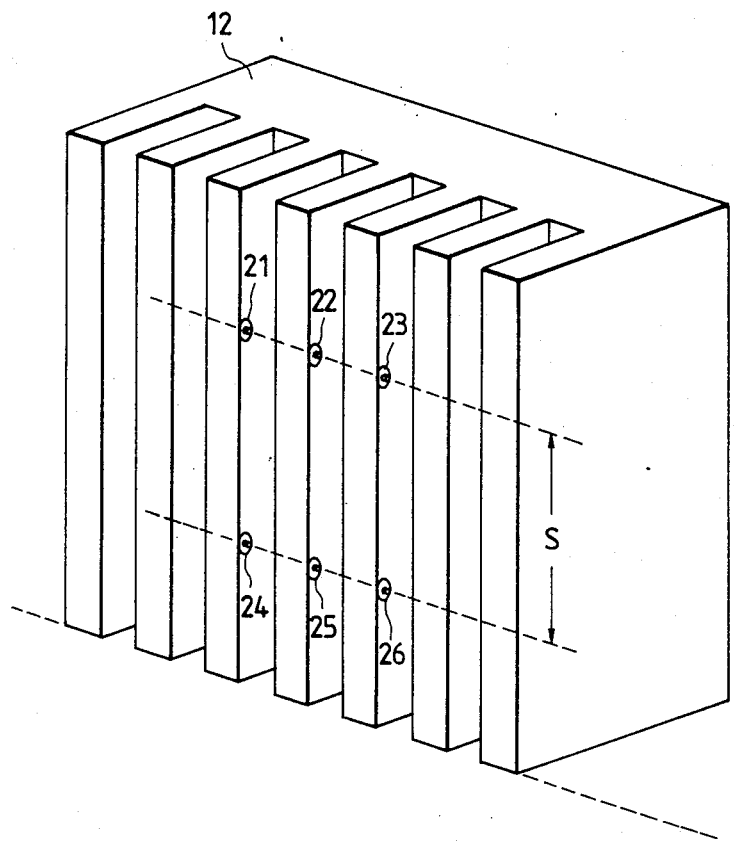
FIG. 2 is a perspective view showing an oscillator according to another embodiment of this invention.

A second embodiment of the present invention will be described hereinbelow with reference to FIG. 2. Parts corresponding to those in FIG. 1 are marked with the same numerals. Generally, in solid-state oscillators, the output level decreases as the oscillation frequency becomes higher, it thereby becoming difficult to obtain a high output in the case of the frequency being high. The second embodiment is for elimination of this problem inherent in the solid-state oscillators. In FIG. 2, on a diffraction grating 12 are provided a plurality of solid-state oscillation elements 21 to 26 which are arranged two-dimensionally so as to form two element lines spaced from each other by S which is integer times of the wavelength. In this case, when all of the solid-state oscillation elements 21 to 26 oscillate simultaneously under the condition that the oscillation frequencies thereof are substantially equal to each other, the frequencies thereof are coincident with each other in accordance with the injection locked phenomenon so as to increase the output of the oscillator. Here, it is also appropriate that some of the solid-state oscillation elements are arranged one-dimensionally so as to form one element line by elements 21, 24 or 21, 22, 23, for example.

Figure 3:
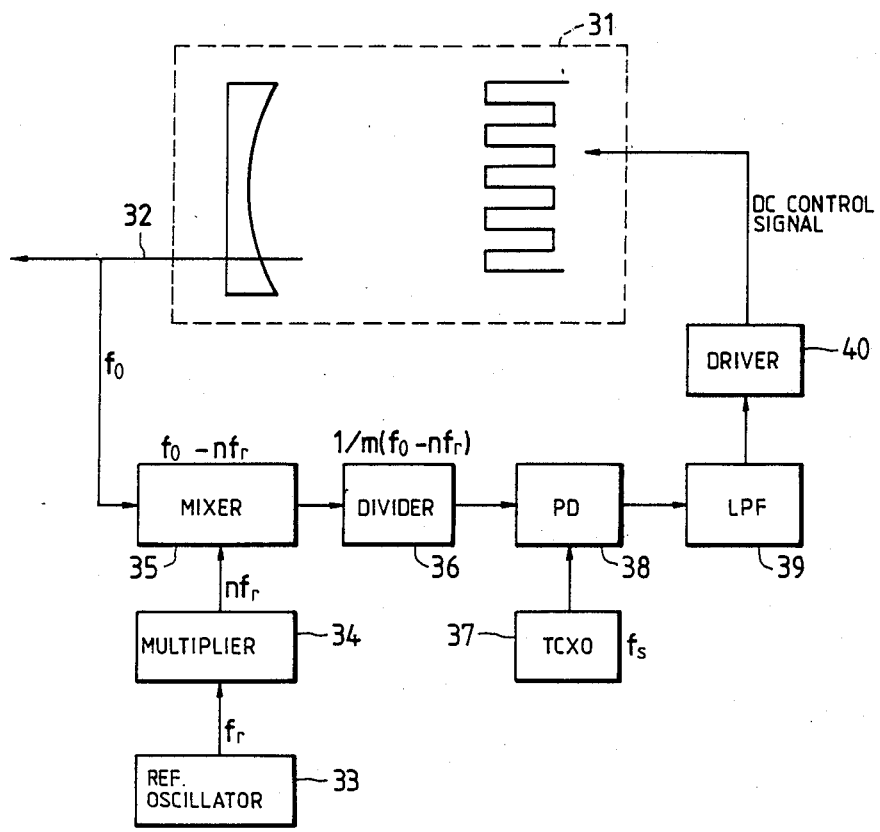
FIG. 3 is a block diagram illustrating an oscillator according to a further embodiment of this invention.

Furthermore, a third embodiment of this invention will be described hereinbelow with reference to FIG. 3. The third embodiment is for improving the stability of the second embodiment. In FIG. 3, illustrated at numeral 31 is an oscillator comprising the FIG. 2 Fabry-Perot type resonator and having a RF output terminal 32 for deriving the output of the oscillator. Designated at numeral 35 is a mixer for mixing the output nfr of a frequency multiplier 34 for multiplexing a reference oscillation signal fr from a reference oscillator 33 and the RF output fo from the RF terminal 32. The mixer 35 is coupled to a frequency divider 36 for dividing the output (fo - nfr) of the mixer 35, which frequency divider 36 is in turn connected to a phase comparator (PD) 38 for phase-comparing the output 1/m(fo - nfr) of the frequency divider 36 and the output fs of a temperature-compensation crystal oscillator (TCXO) 37. The comparison result by the phase comparator 38 is supplied to a low-pass filter (LPF) 39 and a driver 40 which in turn supplies a phase-locked control signal to one of the plurality of oscillation elements of the oscillator 31. That is, the driver 40 drives the one of the plurality of oscillation elements in accordance with the phase difference therebetween so that the phase of the output of the oscillator is coincident with the phase of the temperature-compensation crystal oscillator 37. Here, as described in the second embodiment, when all of the oscillation elements are driven at the same time under the condition that their frequencies are nearly equal to each other, the oscillation outputs of the oscillation elements are synchronized and combined with each other so as to obtain a high output in accordance with the injection locked phenomenon. In this instance, the injection locked phenomenon provides a characteristic that the most stable signal leads the other signals, and therefore, the entire oscillator 31 becomes stable by stabilizing the frequency of anyone of the plurality of oscillation elements (21 to 26 in FIG. 2).

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention. For example, although in the third embodiment the frequency stabilizing circuit is based upon the phase locked system, it is also appropriate that it is based upon the automatic frequency control (AFC) system. In this case, a control signal is obtained by detecting the output of the mixer by a frequency discriminator.

What is claimed is:
1. An oscillator comprising: a mirror;
a diffraction grating disposed in facing and spaced relation to said mirror, said diffraction grating having at least one channel extending in a direction normal to a surface of said mirror; and
at least one oscillation element mounted on said diffraction grating to be positioned within said channel.

2. An oscillator as claimed in claim 1, wherein said mirror is a concave mirror.
3. An oscillator as claimed in claim 1, wherein said mirror is a plane mirror.
4. An oscillator as claimed in claim 1, wherein the resonance mode is TEMoo and the resonance frequency is determined on the basis of the distance between said mirror and said diffraction grating.
5. An oscillator as claimed in claim 4, wherein the distance therebetween is above several times of the oscillation wavelength.
6. An oscillator comprising:
a mirror;
a diffraction grating disposed in facing and spaced relation to said mirror, said diffraction grating having at least one channel extending in a direction normal to a surface of said mirror; and
a plurality of oscillation elements mounted in alignment on portions of said diffraction grating within said channel to.
7. An oscillator comprising:
a mirror;
a diffraction grating disposed in facing and spaced relation to said mirror, said diffraction grating having a plurality of channels extending in a direction normal to a surface of said mirror; and
a plurality of oscillation elements mounted on portions of said diffraction grating within said channels in a plurality of rows.
8. An oscillator as claimed in claim 7, wherein said channels are formed so that said diffraction grating has a comb-like configuration.
9. An oscillator comprising:
a mirror;
a diffraction grating disposed in facing and spaced relation to said mirror, said diffraction grating having at least one channel extending in a direction normal to a surface of said mirror;
a plurality of oscillation elements mounted on portions of said diffraction grating within said channel; and
a control circuit for applying a control signal to one of said plurality of oscillation elements.
10. An oscillator as claimed in claim 9, further comprising receiving means for receiving the RF output of said oscillation elements, and wherein said control circuit comprises a reference oscillator for generating a reference oscillation signal, a frequency multiplexer coupled to said reference oscillator for multiplexing said reference oscillation signal, a mixer coupled to said receiving means and said frequency multiplexer for mixing the output of said frequency multiplexer and said RF output, a frequency divider coupled to said mixer for dividing the output of said mixer, and a phase comparator coupled to said frequency divider for comparing the output of said frequency divider in phase with the output of a temperature-compensation crystal oscillator, the output of said phase comparator being supplied to the one of said plurality of oscillation elements.
11. An oscillator as claimed in claim 10, wherein the resonance mode is TEMoo and the resonance frequency is determined on the basis of the distance between said mirror and said diffraction grating.
12. An oscillator as claimed in claim 10, wherein the distance therebetween is above several times of the oscillation wavelength.

* * * * *